United States Patent [19]

Kenney et al.

[11] 4,292,230

[45] Sep. 29, 1981

[54] SCREEN-PRINTING COMPOSITION AND USE THEREOF

[75] Inventors: Eugene J. Kenney, Apalachin; Donald J. Lazzarini, Binghamton; Robert J. Winters, Endwell, all of N.Y.

[73] Assignee: International Business Machines Corporation, Armonk, N.Y.

[21] Appl. No.: 946,008

[22] Filed: Sep. 27, 1978

[51] Int. Cl.$^3$ ................................................. C08K 3/36
[52] U.S. Cl. ........................ 260/33.2 EP; 260/37 EP; 428/413; 428/446
[58] Field of Search ..... 260/332 EP, 37 EP, 830 TW

[56] References Cited

U.S. PATENT DOCUMENTS

| | | | |
|---|---|---|---|
| 3,367,990 | 2/1968 | Bremmer | 260/830 TW |
| 3,424,707 | 1/1969 | Schaufelberger | 260/32.8 |
| 3,686,045 | 8/1972 | Foster | 156/53 |
| 3,741,858 | 6/1973 | Fujiwara | 161/185 |
| 3,755,253 | 8/1973 | Rice | 260/830 TW |
| 3,759,866 | 9/1973 | Rogers | 260/37 EP |
| 3,780,132 | 12/1973 | Lohr | 260/831 |
| 3,873,637 | 3/1975 | Fujiwara | 260/830 TW |
| 4,129,678 | 12/1978 | Seki | 428/383 |

FOREIGN PATENT DOCUMENTS 1330625  9/1973  United Kingdom .

OTHER PUBLICATIONS

IBM Technical Disclosure Bulletin, vol. 7, No. 9, Feb. 1975.
Lee & Neville, "Handbook of Epoxy Resins", McGraw Hill, New York, pp. 12-2 to 12-15, 1967.
Dow Epoxy Novolac Resins, 1972, Form No. 190-2-0-72.
Shell Chemical Co., Product Guide Epon Resins, SC:71-5, 1971.

*Primary Examiner*—Paul R. Michl
*Attorney, Agent, or Firm*—Pollock, Vande Sande & Priddy

[57] ABSTRACT

Screen-printing composition containing an epoxy novolac, a phenoxy polymer, a liquid anhydride, colloidal silica, and a diluent. The composition is useful for coating substrates such as printed circuits and serves as a solder mask.

32 Claims, No Drawings

SCREEN-PRINTING COMPOSITION AND USE THEREOF

BACKGROUND OF THE INVENTION

The present invention is concerned with screen printing compositions and the use thereof, and is particularly concerned with screen printing compositions which find applicability for coating printed circuits and serve as solder masks.

In the fabrication of high quality printed circuit boards, it is necessary to coat the substrate with a tough, resistant coating in selected areas which serves as a solder mask. In high quality printed circuit boards, molten solder is used to insure good interconnection between the components and the circuitry.

The coating compositions to be used for such applications must possess a number of important characteristics. In particular, the coating compositions must be strongly adherent to a wide variety of metallic and nonmetallic substrates, and resistant to harsh environmental conditions such as high humidity and elevated temperatures. The compositions also must be impervious to a wide variety of solvents, resistant to a large number of different chemicals, and particularly be resistant to commonly-used flux compositions and solders.

Moreover, since it is preferred that the solder masks remain on the circuitry as a protective coating, such must possess electrical insulating properties which last over long periods of time. Also, the compositions must be durable and possess the above properties even after long periods of exposure to a wide variety of chemicals and adverse environmental conditions. The solder masks are left on the circuitry in order to protect it from oxidation and from the adverse effects of such gases as sulfur dioxide, hydrogen sulfide, and chlorine.

The compositions, if to be used in screen printing processes, must also be capable of good pattern definition which is dependent to a large extent upon the flow characteristics of the composition. Basically, the screen printing technique involves squeezing a coating composition through the open meshes of a stretched piece of material such as wire onto a printable substrate. The screen is covered or blocked out in part by a masking material in order to form the desired pattern on the printable substrate. The masking material may simply be a stencil or a dried lacquer, shellac or glue. Once the screen has been covered or blocked out in part by the masking material, it is held taut on a frame and positioned over the desired substrate. The coating composition is then poured onto the screen and squeezed through the open areas with a squeegee. Thereafter, the frame is removed and the coated substrate dried. It is important, when following a desired pattern, that the coating composition not flow or bleed outside of the preselected areas defined by the open areas of the screen but should follow accurately the image formed on the screen and reproduce it.

The present invention provides a screen printing composition which has the requisite properties to make it suitable as a solder mask and a permanent protective coating for high quality printed circuit boards. The screen printing compositions of the present invention not only possess the necessary physical characteristics and chemical resistivities required for such critical use, but also are extremely patternable in that the compositions will accurately reproduce the image on the printing screen. For instance, compositions within the scope of the present invention are capable of holding a pattern within about 4 mils or less.

In addition, the coating compositions of the present invention have improved pot life as compared to a number of other screenable compositions. The pot life of a composition is its stability after being mixed under normal ambient or room temperature conditions. Adequate pot life is essential in that sufficient time is needed after the composition is prepared for using the composition to coat the desired substrate without the composition degrading or curing. Also, the longer the pot life of a composition, the greater the quantity of it which can be prepared at any one time and be stored prior to use.

It has further been noted that the preferred compositions of the present invention greatly reduce the number of bubbles created in the coating during the curing process.

SUMMARY OF THE INVENTION

The present invention is concerned with a screen printing composition which comprises:

(A) about 31 to about 55% by weight of an epoxidized novolac represented by the formula:

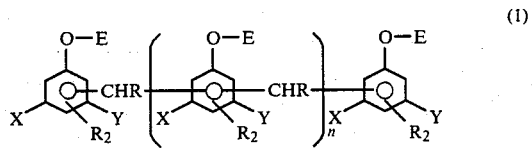

(1)

wherein n is at least about 0.2; E is hydrogen or an epoxyalkyl group, at least two E groups per polymer molecule being an epoxyalkyl group and wherein the epoxyalkyl group is represented by the formula:

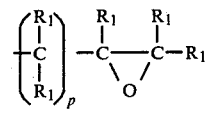

p is an integer from 1-8; R is hydrogen or alkyl or alkylene or aryl or aralkyl or alkaryl or cycloalkyl or furyl group; each $R_1$ individually is hydrogen or alkyl group of up to 7 carbon atoms; wherein the number of carbon atoms in any epoxyalkyl group totals no more than 10 carbon atoms; each X and Y is individually hydrogen or chlorine or alkyl or hydroxy; each $R_2$ individually is hydrogen or chlorine or a hydrocarbon group such as alkyl, aryl, aralkyl, alkaryl, and cycloalkyl;

(B) about 6 to about 12% by weight of a thermoplastic polyhydroxy ether reaction product of a polynuclear dihydric phenol and epichlorohydrin substantially free of 1,2-epoxy groups having the formula

(2)

wherein A is the radical residuum of a polynuclear dihydric phenol, B is an hydroxyl-containing radical residuum of epichlorohydrin, and m is at least about 30;

(C) about 15 to about 21% by weight of a liquid anhydride of a carboxylic acid;

(D) about 4 to about 8% by weight of colloidal silica; and (E) volatile diluent in an amount sufficient to provide a composition with a viscosity of about 14,000 to about 50,000 centipoises determined with a Haake Rotovisco with a shear rate of 249.6/sec. for 1.28 minutes at 25° C.

In addition, the ratio of the epoxidized novolac polymer to the thermoplastic polyhydroxy ether is about 7:1 to about 4:1. The above percentages are based upon the total amounts of (A), (B), (C), (D), and (E) in the composition.

The present invention is also directed to surfaces coated with a cured composition obtained by curing the above-described screen-printing curable composition.

Another aspect of the present invention is a process for treating selected areas of a surface with solder which includes screen-printing the surface of a substrate with a screen-printing curable composition of the type described hereinabove.

The curable composition is then cured such as by exposure to elevated temperatures. Solder is applied to the substrate after curing, thereby forming a solder covered substrate in an image corresponding to the areas of exposed substrate not coated with the screen-printing composition.

DESCRIPTION OF PREFERRED EMBODIMENTS

It is essential, according to the present invention, that a combination of an epoxidized novolac polymer and certain thermoplastic polyhydroxy ethers or phenoxy polymers in particular relative amounts be employed. It has been noted that the use of the phenoxy polymer alone, although providing good definition, provides for very poor solvent and heat resistance in the finished coating. The use of the epoxidized novolac polymer alone provides a brittle composition which does not possess the necessary adhesive characteristics as required by the present invention.

The epoxidized novolac employed according to the present invention can be represented by the formula:

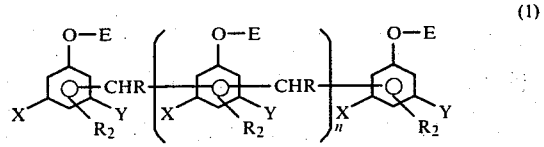

(1)

E, X, Y, R, R$_2$, and n have the same meanings as defined above. Preferably, substantially all of the E groups are epoxyalkyl groups. Generally R, X, Y, and R$_2$, when hydrocarbons, contain no more than about 12 carbon atoms.

The epoxy novolacs can be prepared by known methods by the reaction of a thermoplastic phenolic-aldehyde polymer of a phenol having the formula:

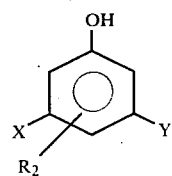

(wherein X, Y, and R$_2$ have the meanings as defined above) with a halo-epoxy alkane of the formula:

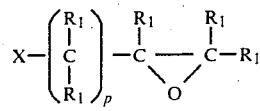

wherein X is a halogen atom (e.g., chlorine, bromine, and the like) and p and R$_1$ have the same meanings as defined hereinabove.

Hydrocarbon-substituted phenols having two available positions ortho or para to a phenolic hydroxy group for aldehyde condensation to provide polymers suitable for the preparation of epoxy novolacs include o- and p-cresols, o- and p-ethyl phenols, o- and p-isopropyl phenols, o- and p-tert-butyl phenols, o- and p-sec-butyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinal, 4-tert-butyl resorcinol, o- and p-benzyl phenyl, o- and p-phenethyl phenols, o- and p-phenyl phenols, o- and p-tolyl phenols, o- and p-xylyl phenols, o- and p-cyclohexyl phenols, o- and p-cyclopentyl phenols, 4-phenethyl resorcinol, 4-tolyl resorcinol, 4-cyclohexyl resorcinol.

Various chloro-substituted phenols which can also be used in the preparation of phenol-aldehyde resins suitable for the preparation of the epoxy novolacs include o- and p-chloro-phenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-ethyl-phenol, 4-chloro-3-isopropyl-phenol, 3-chloro-4-phenyl-phenol, 3-chloro-4-chloro-phenyl-phenol, 3,5-dichloro-4-methyl-phenol, 3,5-dichloro-5-methyl-phenol, 3,5-dichloro-2-methyl-phenol, 2,3-dichloro-5-methyl-phenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,4-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, 5-chloro-4-methyl-resorcinol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, 5-ethyl resorcinol.

As condensing agents any aldehyde may be used which will condense with the particular phenol being used, including formaldehyde, acetaldehyde, propionaldehyde, butyraldehyde, heptaldehyde, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, hexamethylene tetramine. The aldehydes can also be used in the form of a solution, such as the commercially available formalin.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxy-propane, 1-bromo-2,3-epoxy-pentane, 2-chloromethyl-1,2-epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

The preferred epoxidized novolac employed according to the present invention is represented by the formula:

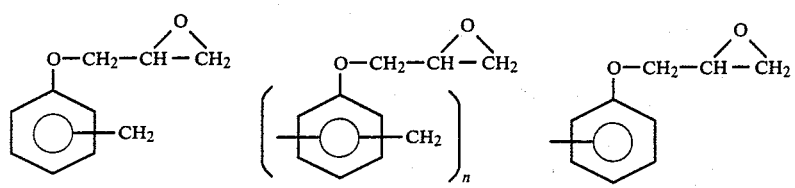

(3)

wherein n is at least about 0.2. The epoxidized novolac can be a liquid, semisolid, or solid, depending upon its molecular weight. Epoxy polymers, wherein n is about 1.5 to about 3.5 are commercially available and are generally suitable for the purposes of the present invention. More preferred epoxy polymers are represented by the above formula wherein n is at least about 1.5. The most preferred epoxy polymers employed according to the present invention are those wherein n is from about 1.6 to about 2. Mixtures of epoxidized novolac polymers of the above formula with different molecular weights can be employed when desired.

Those epoxidized novolac polymers which are non-liquids are the preferred ones to employ according to the present invention. For instance, the liquid novolac polymers are not particularly preferred since the use thereof does not provide as good pattern definition as achieved by using nonliquid epoxidized novolac polymers in view of some degree of bleedout occurring during the screen-printing process. A discussion of some suitable novolac polymers can be found in a publication by Dow entitled "Dow epoxy novolac resins", 1972, Form No. 190-20-72.

The thermoplastic polyhydroxy ethers, which are also referred to in the art as phenoxy polymers, employed according to the present invention are generally reaction products of substantially equal molar quantities of a dihydric phenol and epichlorohydrin having a degree of polymerization such that the molecular weight is about 20,000 to about 50,000, and preferably at least about 22,000. Generally to obtain such molecular weights, the degree of polymerization is at least about 30 and preferably at least about 70. Excellent results have been obtained when employing phenoxy polymers having molecular weights from about 25,000 to about 38,000. The polyhydroxy ethers or phenoxy polymers are substantially free from 1,2-epoxy groups.

The phenoxy polymers can be represented by the repeating unit:

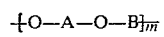

(2)

wherein A is the radical residuum of a polynuclear dihydric phenol and B is an hydroxyl-containing radical residuum of epichlorohydrin. m is the degree of polymerization and generally is at least about 30. The preferred phenoxy polymers are those wherein the dihydric phenol is bisphenol A (i.e., 2,2-bis(p-hydroxy phenyl) propane and can be represented by having the repeating unit:

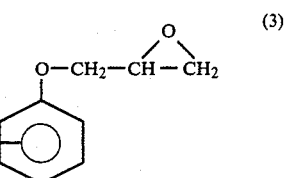

(4)

By representation of the above repeating units, it is not intended to be an assertion that the phenoxy polymers have only the configuration of pure linear polymers. For instance, some branching can occur by reaction of epichlorohydrin or dihydric phenol or both, with pendant hydroxyl groups of the growing polyhydroxy ether chain. Accordingly, the representation of the thermoplastic phenoxy polymers in the terms of the repeating unit:

(2)

is a useful means for determining stoichiometry and the like but is not an accurate depiction of structure such as one may obtain from a monomer or a low molecular weight compound.

The phenoxy polymers employed according to the present invention are substantially free from 1,2-epoxy groups as evidenced by the application of the two "epoxide equivalent" analytical tests described in "Epoxy Resins" by A. Lee and K. Neville, pages 21–25, McGraw-Hill, Inc., New York (1957). Examples of some suitable dihydric phenols can be found in U.S. Pat. No. 3,424,707 to Schaufelberger, disclosure of which dihydric phenols is incorporated herein by reference. Mixtures of the phenoxy polymers can be employed if desired.

Some commercially available phenoxy polymers include Eponol 53, Eponol 55, Epon 1009, Phenoxy PAHJ, Phenoxy PKHC, Phenoxy PKHA, and Phenoxy PKHH.

In order to obtain the critical combination of properties which render the compositions of the present invention acceptable screen coating curable compositions suitable for solder masks and permanent protective coatings for high quality printed circuit boards, it is essential that the epoxidized novolac polymer be employed in amounts of about 31 to about 55%, and preferably about 45 to about 50% by weight, and that the phenoxy polymer be employed in amounts of about 6 to about 12% by weight, and preferably about 7.5 to about 9.5% by weight. In addition, it is essential that the ratio of the epoxidized novolac to the phenoxy polymer be about 7:1 to about 4:1, preferably about 7:1 to about 4.5:1, and more preferably about 6:1 to about 5:1. The most preferred ratio is about 5.5:1. These relative amounts are based upon the total amount of the five essential constituents of the composition as noted hereinabove. In addition, it is essential to the practice of the present invention that the epoxy polymer employed be an epoxidized novolac polymer and preferably be a nonliquid epoxidized novolac as discussed hereinabove. If the required relative amounts between the epoxidized novolac and phenoxy polymer are not employed and/or if the epoxy polymer is not an epoxidized novolac, then the properties essential to providing a screen-printing curable composition having the improved characteristics achieved by the present invention would not be achieved.

Although the prior art has suggested mixtures of phenoxy resins and certain epoxies in certain amounts, the particular combination as required by the present invention has not been suggested and is not apparent from the prior art. In particular, U.S. Pat. Nos. 3,741,858 and 3,873,637 to Fujiwara et al suggest adhesive compositions which can contain a phenoxy resin and a low molecular weight epoxy which can be an epoxy novolac resin. However, these two patents do not explicitly employ the relative amounts between the epoxy and phenoxy as required by the present invention. In addition, these two patents do not suggest the preferred nonliquid epoxidized novolac polymers used herein. Furthermore, these two patents fail to suggest the present invention since they are not concerned with providing screenable coating compositions and accordingly are not concerned with the particular problems to which the present invention is directed.

U.S. Pat. No. 3,780,132 to Lohr is concerned with a primer composition for aluminum sheets wwhich can contain a phenol formaldehyde resin, an epoxy novolac resin, and a phenoxy resin along with certain other ingredients. However, this patent also fails to suggest the present invention since, among other things, it does not employ the specific relative amounts between the phenoxy and epoxy polymers as required by the present invention. In addition, the preferred nonliquid epoxidized novolac polymers are not suggested therein. Also, it is noted that this patent is not concerned with providing a screenable coating composition and therefore is not concerned with the particular problems to which the present invention is directed.

U.S. Pat. No. 3,424,707 to Schaufelberger suggests compositions containing a mixture of a phenoxy resin in combination with a liquid polyepoxide. However, this patent fails to suggest the present invention since the particular epoxidized novolac polymers required by the present invention are not employed therein and since the compositions are not suggested as being suitable for screen-printing applications. Moreover, this patent clearly teaches away from using the preferred nonliquid epoxidized novolac polymers employed according to the present invention. Among these lines, see column 2, lines 35-43 thereof.

Also of interest concerning this subject matter are U.S. Pat. Nos. 3,177,090, 3,316,323, 3,388,036, 3,445,282, 3,551,249, 3,554,958, 3,560,388, and 3,609,116 which suggest compositions which can contain a phenoxy polymer or a bisphenol A-epichlorohydrin type epoxy polymer in combination with another type of epoxy.

Also of interest with respect to disclosures of phenoxy resins are U.S. Pat. Nos. 3,320,090, 3,336,257, 3,375,297, 3,395,118, 3,480,695, 3,509,095, 3,631,126, 3,881,977, 3,904,813, and 3,983,301.

The compositions according to the present invention also contain from about 13 to about 25 parts by weight and preferably from about 16 to about 21 parts by weight of a liquid anhydride of a carboxylic acid. The anhydride can be from a mono or preferably a polycarboxylic acid. The anhydride functions both as a curing agent for the epoxy polymer and also as a diluent to facilitate and achieve the proper flow characteristics of the composition.

Examples of some suitable anhydrides include acetic anhydride, dodecenyl succinic anhydride, and preferably nadic methyl anhydride. The anhydrides must be liquid at normal room temperatures (e.g., about 25° C.).

Another essential constituent of the compositions of the present invention is colloidal silica which acts as a thickening agent. It is essential that the thickening agent be a colloidal silica. For instance, other general types of thickening agents have been tried along with the other constituents of the present invention but such have not provided a satisfactory screenable composition possessing the necessary qualities to be used for a solder mask and permanent protective coating for high quality printed circuit boards. For instance, micromica 3000, Britesorb and certain clay salts such as Bentone have been tested by applicants but have been found unsuitable for the purposes of the present invention.

Colloidal silica is silica having a surface area of about 50 to about 500 $m^2$/gram (determined by the BET nitrogen adsorption material) with particles having diameters from about 5 to about 20 millimicrons. Colloidal silica, used according to the present invention, is preferably fused silica gel or fumed silicon dioxide as it is sometimes called. In addition, the colloidal silica is often referred to in the art as silica aerogel. Fused silica is obtained by the hydrolysis or combustion of silicon tetrachloride in hydrogen-oxygen furnaces. Examples of some commercially available colloidal silicas include Cab-O-Sil and Santocel. The silica is employed in amounts of about 4 to about 8 and preferably about 4.5 to about 6% by weight. The compositions of the present invention also contain a volatile diluent in an amount sufficient to provide a composition which has a viscosity of about 14,000 to about 50,000, and preferably about 20,000 to about 50,000 centipoises. The viscosity is determined with a Haake Rotovisco with a shear rate of 249.6/sec. for 1.28 minutes at 25° C. Generally, the amount of diluent is about 15 to about 25% by weight, and preferably about 19 to about 21% by weight.

The diluent is selected so that it has a suitable volatility and capable of dissolving the solid materials of the composition. The volatility should be selected so that it has proper flow characteristics and is not too fast of an evaporating material so as to minimize the formation of bubbles in the coated article. Examples of some suitable solvents include the mono and dialkyl ethers of ethylene glycol as well as certain of their derivatives such as those which are commercially available under the trade designations carbitol and cellosolve. Examples of some specific diluents of this type include diethylene glycol monobutyl ether available under the trade designation butyl carbitol, diethyleneglycolmonobutyl ether acetate under the trade designation butylcarbitol acetate, diethyleneglycolmonoethyl ether acetate under the trade designation carbitol acetate, diethyleneglycolmonoethyl ether under the trade designation carbitol, diethyleneglycoldibutyl ether under the trade designation dibutyl carbitol, diethyleneglycoldiethyl ether under the trade designation diethyl carbitol, diethyleneglycolmonohexyl ether under the trade designation N-hexylcarbitol, diethyleneglycolmonomethyl ether under the trade designation methylcarbitol, diethyleneglycolmonomethyl ether acetate under the trade designation methylcarbitol acetate, ethyleneglycolmonobutyl ether under the trade designation butyl cellosolve, ethyleneglycolmonobutyl ether acetate under the trade designation butyl cellosolve acetate, ethyleneglycolmonoethyl ether acetate under the trade designation cellosolve acetate, ethyleneglycolmonoethyl ether under the trade designation cellosolve solvent, ethyleneglycoldibutyl ether under the trade designation dibutyl cellosolve, ethyleneglycolmonohexyl ether under the trade designation n-hexyl cellosolve, ethyleneglycolmonomethyl ether under the trade designation methyl cellosolve, ethyleneglycolmonomethyl ether acetate under the trade designation methyl cellosolve acetate, and ethyleneglycolmonophenyl ether under the trade designation phenyl cellosolve.

Mixtures of diluents can be employed when desired. Preferably the diluent is a mixture of cellosolve acetate and diethyl carbitol. When such a mixture is employed, the composition generally includes about 15 to about 21% by weight of cellosolve acetate and from about 0.1% to about 3% by weight of diethyl carbitol.

The cellosolve acetate is mainly employed to dissolve the phenoxy polymer and the diethylcarbitol is employed to provide the proper speed of evaporation and viscosity. For instance, it has been found that replacing the diethyl carbitol with less preferred solvents such as butyl carbitol results in a less effective composition in that the evaporation characteristics of the diethyl carbitol are more suitable to the compositions of the present invention.

By the proper selection of all of the above constituents, the preferred compositions of the present invention provide excellent solder masks which are screenable and which overcome the above-discussed problems with respect to bubble formation, short pot life, exudation of the compositions under the pattern, stringing and the need to provide more precise pattern definition. The compositions of the present invention have very long pot lives. In fact, the pot life of such compositions prior to the addition of the epoxy curing agent has been increased up to at least about one year without gelation or degradation of the compositions at about 40° F. and at least about one month at normal room temperatures (e.g., 77° F.).

Accordingly, by the judicious selection of a number of constituents as discussed hereinabove, as well as a balancing of their relative amounts, it has been possible to achieve a screenable solder mask composition possessing a good combination of the above-discussed desirable properties.

In addition to the above constituents, the compositions of the present invention can optionally include an accelerator for the cure of the epoxy polymer in addition to the anhydride. The accelerating agent is employed in the preferred compositions since it facilitates employing reduced temperatures for the cure of the compositions. The accelerating agent is generally used in amounts up to about 6% by weight and preferably about 2 to about 6% by weight and most preferably about 3 to about 4% by weight.

The accelerating agent is desirably a liquid at normal room temperatures and include such known curing agents for epoxy polymers as the amide-, imine-, and amine-type curing agents. Examples of some suitable amines include diethylenetriamine, 2,4,6-tris-N,N'-dimethylaminoethyl phenol, triethylenetetramine and tetraethylenepentamine. The suitable amines are generally polyamines and contain at least two primary or secondary nitrogen atoms and a combined total of at least three active hydrogen atoms. Examples of some suitable commercially available epoxy curing agents are discussed in the publication by the Shell Chemical Company entitled "Product Guide", Epon$^R$ resins SC:71-5, 1971. The preferred curing agent employed according to the present invention is 2-ethoxyhexanoic acid salt of 2,4,6-tris-N,N'-dimethylaminomethyl phenol which is commercially available from Shell Oil Company under the trade designation Epon-D. The Epon-D is the preferred curing agent since it does not affect the screenability of the coating composition and provides just the right acceleration of the cure in that it does not react too fast as compared to a number of other commercially available curing agents.

The accelerator for curing the epoxy is normally added to the composition just prior to the coating operation.

In addition to the above constituents, the compositions of the present invention can optionally include up to about 1 and preferably up to about 0.5% by weight of a leveling agent in order to facilitate obtaining smooth coatings. Examples of some leveling agents include Modaflow from Monsanto Company, aluminum stearate, calcium stearate, sucrose benzoate, high molecular weight nonionic surface-active agents, and a material known as paint additive No. 3 which is a 12% solution of an alkyl substituted cyclic silsexquioxane in toluene. In addition, the above compositions can contain amounts up to about 0.2% and preferably up to about 0.1% by weight of a UV brightener which can be used as an inspection tool to determine whether the composition has coated all of the desired preselected areas by shining ultraviolet light onto the composition and observing the light feedback. An example of such a brightener is available commercially under the trade designation Tin-O-Pal PCR.

Also, if desired, depending upon the final use of the composition, such can contain minor amounts of fillers or pigments (e.g., up to about 5% by weight) such as titanium dioxide and calcium carbonate.

The compositions of the present invention find particular application as screenable coating compositions to be used as solder masks and to be retained on the circuit board as a protective coating for the circuit. For most applications, the coatings are provided in thicknesses from about 0.1 to about 10 mils, and preferably from about 0.4 to about 4 mils.

The compositions of the present invention can be cured by the use of elevated temperatures. Typically temperatures of about 100° to 160° C. for about 20 to about 40 minutes are quite adequate for curing compositions employing Epon D as an accelerator. The selection of different temperatures and/or times, if desired when employing other accelerators, can be carried out without undue experimentation by persons skilled in the art once aware of the present disclosure. Also, it is noted that the temperature and time for affecting the cure are inversely related. For instance, as the temperature is increased, the time needed to effect cure is decreased. When used as a solder mask, the process involves applying a solder to the substrate after the above composition has been cured. This forms a solder covered substrate in an image which corresponds to the areas to the exposed substrate not coated with the composition.

The following nonlimiting examples are presented to further illustrate the present invention.

EXAMPLE 1

About 1230.6 parts by weight (about 29.3%) of a 29.5% solution in cellosolve acetate of a phenoxy available under the trade designation phenoxy PKHC are added to a high speed planetary mixer. The phenoxy has a molecular weight of about 29,500 to 32,500 and is from epichlorohydrin and bisphenol-A. About 784.1 parts by weight (about 18.67%) of nadic methylanhydride are added to the phenoxy solution, followed by the addition of about 4.2 parts by weight (about 0.1%) of paint additive #3 and about 4.2 parts by weight (about 0.1%) of diethyl carbitol. Next, about 1948.4 parts (about 46.39%) of an epoxidized novolac available under the trade designation DEN 439 are added. The epoxidized novolac is heated to about 170° F. prior to its addition to permit it to flow. After this, about 2.9 parts (about 0.07%) of Tin-O-Pal and about 225.5 parts (about 5.37%) of Cab-O-Sil M-5 are added to the mixture. The above addition of constituents takes about 10 minutes.

After the addition of all of the constituents, the mixer is closed and the composition is mixed employing high speed stirring. The stirring is continued until the Cab-O-Sil is fully blended into the composition which usually requires about 15–20 minutes of stirring. About 153.7 parts (about 3.66%) of Epon D are added to the composition.

The above composition is coated in a predetermined pattern onto one side of a printed circuit panel to a thickness of about 2 mils employing a screen coating technique using a 120 mesh wire screen. The coated panel is partially cured by use of elevated temperature of about 80° C. for about 10 minutes. The other side of the printed circuit panel is coated in a predetermined pattern with the above composition to a thickness of about 2 mils employing a screen coating technique using a 120 mesh wire screen. Both sides of the coated panel are then cured by exposure to a temperature of about 150° C. for about 40 minutes.

The coating is very smooth, exhibits very slight bubbling, and possesses good solder resistance characteristics. After 400 hours to testing in high temperature (about 75°–100° C.) and high humidity (about 80% relative humidity), the insulating characteristic of the coating is at least about $10^8$ ohms. Also, the coating accurately followed the pattern. DEN 439 is an epoxy novolac represented by formula 3 above wherein n is 1.8.

EXAMPLE 2

The general procedure of Example 1 is repeated except that the composition contains about 29.3% of a 29.5% solution of phenoxy PKHC in cellosolve acetate, about 18.1% of nadic methyl anhydride, about 0.98% of paint additive #3, about 1.41% of diethyl carbitol, about 46% of DEN 439, about 0.07% of Tin-O-Pal, about 4.3% of Cab-O-Sil M-5, and about 3.66% of Epon-D. The results obtained are similar to that of Example 1.

EXAMPLE 3

The general procedure of Example 1 is repeated except that the composition contains about 28.9% of a 29.5% solution of phenoxy PKHC in cellosolve acetate, about 17.34% of nadic methyl anhydride, about 1.13% of paint additive #3, about 1.92% of diethyl carbitol, about 45.8% of DEN 439, about 0.07% of Tin-O-Pal, about 4.8% of Cab-O-Sil M-5, and about 3.66% of Epon-D. The results obtained are similar to Example 1.

EXAMPLE 4

The general procedure of Example 1 is repeated except that the composition contains about 29.3% of a 29.5% solution of phenoxy PKHC in cellosolve acetate, about 18.34% of nadic methyl anhydride, about 1.12% of paint additive #3, about 2.13% of diethyl carbitol, about 44.3% of DEN 439, about 0.07% of Tin-O-Pal, about 4.8% of Cab-O-Sil M-5, and about 3.66% of Epon-D. The results obtained are similar to those of Example 1.

EXAMPLE 5

The general procedure of Example 1 is repeated except that the composition contains about 28.8% of a 29.5% solution of phenoxy PKHC in cellosolve acetate, about 18.22% of nadic methyl anhydride, about 1.1% of paint additive #3, about 1.89% of diethyl carbitol, about 45.14% of DEN 439, about 0.07% of Tin-O-Pal, about 4.7% of Cab-O-Sil M-5, and about 3.66% of Epon-D. The results obtained are similar to those of Example 1.

EXAMPLE 6

The general procedure of Example 1 is repeated except that the composition contains about 29.1% of a 29.5% solution of phenoxy PKHC in cellosolve acetate, about 18.2% of nadic methyl anhydride, about 1.05% of paint additive #3, about 1.84% of diethyl carbitol, about 45% of DEN 439, about 0.07% of Tin-O-Pal, about 4.74% of Cab-O-Sil M-5, and about 3.66% of Epon-D. The results obtained are similar to those of Example 1.

EXAMPLE 7

The general procedure of Example 1 is repeated except that the composition contains about 22% of a 29.5% solution of phenoxy PKHC in cellosolve acetate, about 18.9% of nadic methyl anhydride, about 1% of paint additive #3, about 1.47% of diethyl carbitol, about 48.1% of DEN 438, about 0.19% of Tin-O-Pal, about 4.93% of Cab-O-Sil M-5, and about 3.66% of Epon-D. DEN 438 is an epoxy novolac having the formula of the preferred epoxy novolac wherein n equals 1.6 as compared to 1.8 for DEN 439. The results obtained are similar to Example 1 except that some bleedout is observed during curing. The composition exhibits good screenability.

EXAMPLE 8

The general procedure of Example 1 is repeated except that the composition contains about 25.3% of a 29.5% solution of phenoxy PKHC in cellosolve acetate, about 18.1% of nadic methyl anhydride, about 0.98% of paint additive #3, about 1.41% of diethyl carbitol, about 46% of DEN 438, about 0.18% of Tin-O-Pal, about 4.72% of Cab-O-Sil M-5, and about 3.66% of Epon-D. The results obtained are similar to those of Example 7.

EXAMPLE 9

The general procedure of Example 1 is repeated except that the composition contains about 26.5% of a 29.5% solution of phenoxy PKHC in cellosolve acetate, about 17.75% of nadic methyl anhydride, about 0.96% of paint additive #3, and 1.39% of diethyl carbitol, about 45.2% of DEN 438, about 0.18% of Tin-O-Pal, about 4.64% of Cab-O-Sil M-5, and about 3.66% of Epon-D. The results obtained are similar to those of Example 7.

EXAMPLE 10

The general procedure of Example 1 is repeated except that the composition contains about 28.3% of a 29.5% solution of phenoxy PKHC in cellosolve acetate, about 17.33% of nadic methyl anhydride, about 0.94% of paint aditive #3, about 1.35% of diethyl carbitol, about 44% of DEN 438, about 0.18% of Tin-O-Pal, about 4.52% of Cab-O-Sil M-5, and about 3.66% of Epon-D. The results obtained are not as good as those of Example 7 since the composition does not possess as good screenability characteristics as that of Example 7. The screenability characteristics of the composition of this example, although adequate for certain applications, are not adequate for a commercially acceptable system for high quality printed circuits. What is claimed is:

1. A screen-printing curable composition consisting essentially of:
   (A) about 31 to about 55% by weight of a non-liquid epoxidized novolak represented by the formula:

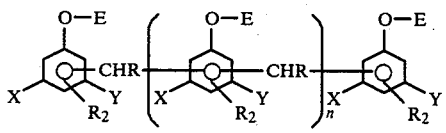
(1)

wherein n is at least about 0.2; E is hydrogen or an epoxyalkyl group, at least two E groups per polymer molecule being an epoxyalkyl group and wherein the epoxyalkyl group is represented by the formula:

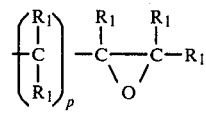

p is an integer from 1-8; R is hydrogen or alkyl or alkylene or aryl or aralkyl or alkaryl or cycloalkyl or furyl group; each $R_1$ individually is hydrogen or alkyl group of up to 7 carbon atoms; wherein the number of carbon atoms in any epoxy-alkyl group totals no more than 10 carbon atoms; each X and Y is individually hydrogen or chlorine or alkyl or hydroxyl; each $R_2$ individually is hydrogen or chlorine or a hydro-carbon group;

(B) about 6 to about 12% by weight of a thermoplastic polyhydroxy ether reaction product of a polynuclear dihydric phenol and epichlorohydrin substantially free of 1,2-epoxy groups having the formula:

wherein A is the radical residuum of a polynuclear dihydric phenol, B is an hydroxyl-containing radical residuum of epichlorohydrin, and m is at least 30;

(C) about 15 to about 21% of weight of a liquid anhydride of carboxylic acid;

(D) about 4.5 to about 6% by weight of colloidal silica and wherein said colloidal silica has a surface area of about 50 to about 400 m²/gram and the particles have a diameter of about 5 to about 20 millimicrons; and (E) volatile diluent in an amount sufficient to provide a composition with a viscosity of about 14,000 to about 50,000 centipoises determined with a Haake Rotovisco with a shear rate of 249.6/sec. for 1.28 minutes at 25° C.; and wherein the ratio of (A):(B) is about 7:1 to aout 4:1, the above amounts being based upon the total of (A), (B), (C), (D), and (E) in said composition.

2. The composition of claim 1 wherein said epoxidized novolac is represented by the formula:

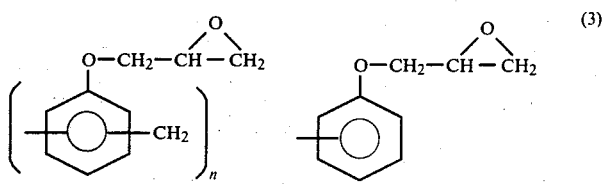
(3)

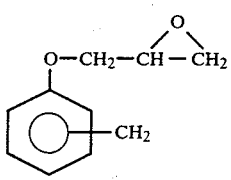

3. The composition of claim 1 wherein said epoxidized novolac is represented by the formula:

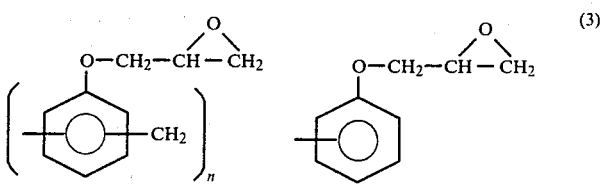
(3)

wherein n is at least about 1.5.

4. The composition of claim 1 wherein said epoxidized novolac is represented by the formula:

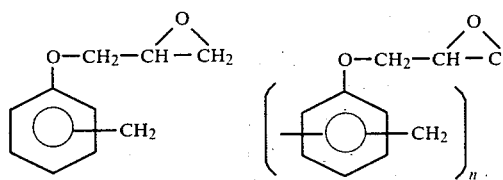
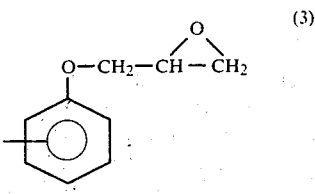

(3)

wherein n is from about 1.5 to about 2.

5. The composition of claim 1 wherein said thermoplastic polyhydroxy ether is the reaction product of bisphenol-A and epichlorohydrin and is represented by the formula:

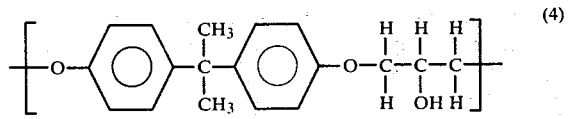

(4)

6. The composition of claim 5 wherein the molecular weight of said thermoplastic polyhydroxy ether is from about 20,000 to about 50,000.
7. The composition of claim 5 wherein the molecular weight of said polyhydroxy ether is from about 25,000 to about 38,000.
8. The composition of claim 5 wherein the molecular weight of said polyhydroxy ether is about 29,500 to about 32,500.
9. The composition of claim 1 wherein said anhydride is nadic methyl anhydride.
10. The composition of claim 9 wherein said silica is fused silica gel.
11. The composition of claim 1 which further includes up to about 6% by weight of an accelerating agent for the cure of the epoxy.
12. The composition of claim 1 wherein the amount of said accelerating agent is about 2 to about 6% by weight.
13. The composition of claim 12 wherein said curing agent is 2-ethoxyhexanoic acid salt of 2,4,6-tris-N,N'-dimethylaminomethyl phenol.
14. The composition of claim 1 wherein said volatile diluent is a mono or dialkyl ether of ethyleneglycol or derivative thereof.
15. The composition of claim 1 wherein said volatile diluent is a mixture of cellosolve acetate and of diethyl carbitol wherein the composition contains about 15 to 21% by weight of said cellosolve acetate and about 0.1 to about 3% by weight of diethyl carbitol.
16. The composition of claim 1 which contains from about 45 to about 50% by weight of (A), about 7.5 to about 9.5% by weight of (B), about 16 to about 21% by weight of (C), about 4.5 to about 6% by weight of (D), about 15 to about 25% by weight of (E), and from about 2 to about 6% by weight of an accelerating agent (F) for cure of the epoxy wherein said amounts are based upon the total amount of (A), (B), (C), (D), (E), and (F) in said composition.
17. The composition of claim 16 which contains about 19 to about 21% by weight of (E), and from about 3 to about 4% by weight of (F), wherein said amounts are based upon the total amount of (A), (B), (C), (D), (E), and (F) in said composition.
18. The composition of claim 1 which further includes a leveling agent.

19. The composition of claim 18 wherein said leveling agent is present in an amount up to about 1% by weight.
20. The composition of claim 1 which has a viscosity of about 20,000 to about 50,000 centipoises.
21. The composition of claim 1 wherein the ratio of A:B is 4.5:1 to 7.1.
22. The composition of claim 1 wherein the ratio of A:B is 5:1 to 6:1.
23. The composition of claim 1 wherein the ratio of A:B is 5.5:1.
24. The composition of claim 1 wherein said composition further includes a UV brightener.
25. A surface coated with a cured composition from:
(A) about 31 to about 55% by weight of a non-liquid epoxidized novolac represented by the formula:

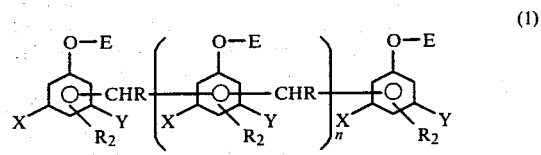

(1)

wherein n is at least about 0.2; E is hydrogen or an epoxyalkyl group, at least two E groups per polymer molecule being an epoxyalkyl group and wherein the epoxyalkyl group is represented by the formula:

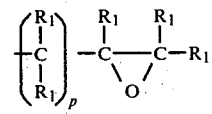

p is an integer from 1–8; R is hydrogen or alkyl or alkylene or aryl or aralkyl or alkaryl or cycloalkyl or furyl group; each $R_1$ individually is hydrogen or alkyl group of up to 7 carbon atoms; wherein the number of carbon atoms in any epoxyalkyl group totals no more than 10 carbon atoms, each X and Y is individually hydrogen or chlorine or alkyl or hydroxyl; each $R_2$ individually is hydrogen or chlorine or a hydrocarbon group;
(B) about 6 to about 12% by weight of a thermoplastic polyhydroxy ether reaction product of a polynuclear dihydric phenol and epichlorohydrin substantially free of 1,2-epoxy groups having the formula:

(2)

wherein A is the radical residuum of a polynuclear dihydric phenol, B is an hydroxyl-containing radical residuum of epichlorohydrin, and m is at least 30;
(C) about 15 to about 21% by weight of a liquid anhydride of carboxylic acid;

(D) about 4.5 to about 6% by weight of colloidal silica; and wherein said colloidal silica has a surface area of about 50 to about 400 m²/gram, and the particles have a diameter of about 5 to about 20 millimicrons; and (E) volatile diluent in an amount sufficient to provide a composition with a viscosity of about 14,000 to about 50,000 centipoises determined with a Haake Rotovisco with a shear rate of 249.6 1sec. for 1.28 minutes at 25° C; and wherein the ratio of (A):(B) is about 7:1 to about 4:1, the above amounts being based upon the total of (A), (B)l, (C), (D), and (E) in said composition.

26. The composition of claim 1 wherein said epoxidized novolak is a non-liquid represented by the formula:

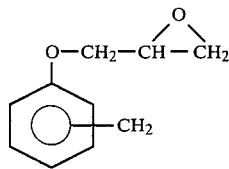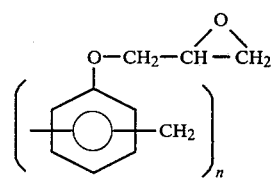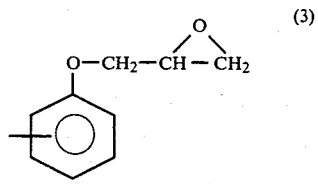

(3)

wherein n is from about 1.5 to about 2;
said thermoplastic polyhydroxy ether is the reaction product of bisphenol-A and epochlorohydrin and is represented by the formula:

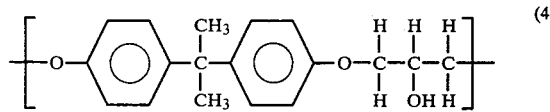

(4)

wherein the molecular weight of said polyhydroxy ether is from about 25,000 to about 38,000;
said anhydride is nadic methyl anhydride; and said volatile diluent is a mono or dialkyl ether of ethyleneglycol or derivative thereof, and said composition has a viscosity of about 20,000 to about 50,000 centipoises.

27. The composition of claim 26 wherein said colloidal silica has a surface area of about 50 to about 400 m²/gram and the particles have a diameter of about 5 to about 20 millimicrons.

28. The composition of claim 26 wherein the amount of said accelerating agent is about 2 to about 6% by weight.

29. The composition of claim 28 wherein said curing agent is 2-ethoxyhexanoic acid salt of 2,4,6-tris-N,N'-dimethylaminomethyl phenol.

30. The composition of claim 26 wherein said volatile diluent is a mixture of cellosolve acetate and of diethyl carbitol wherein the composition contains about 15 to 21% by weight of said cellosolve acetate and about 0.1 to about 3% weight of diethyl carbitol.

31. The composition of claim 26 which contains from about 45 to about 50% by weight of (A), about 7.5 to about 9.5% by weight of (B), about 16 to about 21% by weight of (C), about 4.5 to about 6% by weight of (D), about 15 to about 25% by weight of (E), and from about 2 to about 6% by weight of an accelerating agent (F) for cure of the epoxy wherein said amounts are based upon the total amount of (A), (B), (C), (D), (E), and (F) in said composition.

32. The composition of claim 31 wherein the ratio of A:B is 5:1 to 6:1.

* * * * *